US012355006B2

(12) United States Patent
Li et al.

(10) Patent No.: US 12,355,006 B2
(45) Date of Patent: Jul. 8, 2025

(54) SEMICONDUCTOR PACKAGES AND METHODS OF MANUFACTURING THEREOF

(71) Applicant: Taiwan Semiconductor Manufacturing Company, Ltd., Hsinchu (TW)

(72) Inventors: Shenggao Li, Cupertino, CA (US); Tze-Chiang Huang, Saratoga, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 519 days.

(21) Appl. No.: 17/825,360

(22) Filed: May 26, 2022

(65) Prior Publication Data

US 2023/0260965 A1   Aug. 17, 2023

Related U.S. Application Data

(60) Provisional application No. 63/310,687, filed on Feb. 16, 2022.

(51) Int. Cl.
*H01L 25/065* (2023.01)
*H01L 23/00* (2006.01)
(Continued)

(52) U.S. Cl.
CPC ........ *H01L 25/0657* (2013.01); *H01L 23/481* (2013.01); *H01L 23/5226* (2013.01);
(Continued)

(58) Field of Classification Search
CPC .......... H01L 25/0657; H01L 23/481; H01L 23/5226
See application file for complete search history.

(56) References Cited

U.S. PATENT DOCUMENTS

| 7,868,603 B2 * | 1/2011 | Lacombe | ............. H02M 3/156 |
| | | | 323/285 |
| 10,146,283 B2 * | 12/2018 | Jahagirdar | ................ G06F 1/26 |

(Continued)

FOREIGN PATENT DOCUMENTS

| CN | 102213967 A | 10/2011 | |
| CN | 219476686 U | * 8/2023 | ........... H01L 23/481 |

(Continued)

OTHER PUBLICATIONS

Office Action issued in connection with Taiwan Appl. No. 111147142 dated Dec. 26, 2023.

*Primary Examiner* — Laura M Menz
(74) *Attorney, Agent, or Firm* — FOLEY & LARDNER LLP

(57) ABSTRACT

A semiconductor package includes a first die comprising a voltage regulator that has a first input and a second input. The semiconductor package includes a second die coupled to the first die and comprising a first load circuit. The voltage regulator is configured to provide a regulated voltage to the first load circuit through a first through via structure based on a first voltage received through the first input and a second voltage received from the first load circuit through a second through via structure. The first voltage is a constant reference voltage, and the second voltage is a first signal sensed from the first load circuit.

20 Claims, 13 Drawing Sheets

(51) Int. Cl.
  *H01L 23/48* (2006.01)
  *H01L 23/522* (2006.01)
  *H01L 25/00* (2006.01)
  *G05F 1/575* (2006.01)

(52) U.S. Cl.
  CPC .............. *H01L 24/16* (2013.01); *H01L 25/50* (2013.01); *G05F 1/575* (2013.01); *H01L 2224/16225* (2013.01)

(56) References Cited

U.S. PATENT DOCUMENTS

| | | | |
|---|---|---|---|
| 10,170,448 B2 * | 1/2019 | El-Mansouri | G05F 1/10 |
| 10,409,346 B2 * | 9/2019 | Jahagirdar | G06F 1/3243 |
| 10,429,913 B2 * | 10/2019 | Jahagirdar | G06F 1/3296 |
| 11,049,830 B2 * | 6/2021 | Marquart | H01L 24/81 |
| 11,070,129 B2 * | 7/2021 | Bose | H03K 19/20 |
| 11,267,695 B2 * | 3/2022 | Deas | B81B 7/0019 |
| 11,349,482 B2 * | 5/2022 | Bose | H02M 1/36 |
| 11,616,068 B1 * | 3/2023 | Vimercati | G11C 5/025 |
| | | | 365/145 |
| 11,764,171 B2 * | 9/2023 | Yu | H01L 21/4853 |
| | | | 257/531 |
| 12,132,028 B2 * | 10/2024 | Abdel-Dayem | H01L 23/642 |
| 2013/0176009 A1 * | 7/2013 | Yang | H02M 3/156 |
| | | | 323/274 |
| 2013/0285739 A1 * | 10/2013 | Blaquiere | H01L 23/36 |
| | | | 29/832 |
| 2016/0093588 A1 * | 3/2016 | Wang | H01L 24/18 |
| | | | 257/737 |
| 2016/0211241 A1 * | 7/2016 | Law | H03K 17/56 |
| 2018/0158800 A1 * | 6/2018 | El-Mansouri | G05F 1/10 |
| 2018/0341305 A1 * | 11/2018 | Jahagirdar | G06F 1/3243 |
| 2018/0341306 A1 * | 11/2018 | Jahagirdar | G06F 1/3296 |
| 2019/0333550 A1 * | 10/2019 | Fisch | G11C 5/145 |
| 2020/0055726 A1 * | 2/2020 | Deas | B81B 7/0019 |
| 2020/0321948 A1 * | 10/2020 | Bose | H02M 3/155 |
| 2021/0050318 A1 * | 2/2021 | Marquart | H01L 25/0655 |
| 2021/0103308 A1 * | 4/2021 | Liu | G05F 1/467 |
| 2022/0077109 A1 * | 3/2022 | Chava | H01L 25/0657 |
| 2022/0375898 A1 * | 11/2022 | Pandit | H01L 25/0657 |
| 2023/0060727 A1 * | 3/2023 | Radhakrishnan | H01L 24/73 |
| 2023/0068300 A1 * | 3/2023 | Bharath | H01L 23/49822 |
| 2023/0260965 A1 * | 8/2023 | Li | H01L 23/481 |
| | | | 257/668 |
| 2023/0318450 A1 * | 10/2023 | Grande | H02M 3/07 |
| 2024/0063183 A1 * | 2/2024 | Elsherbini | H01L 24/16 |
| 2024/0332034 A1 * | 10/2024 | Li | H01L 24/20 |
| 2024/0332236 A1 * | 10/2024 | Li | H01L 23/3128 |
| 2025/0006713 A1 * | 1/2025 | Gudigopuram | H05K 3/368 |

FOREIGN PATENT DOCUMENTS

| | | | | |
|---|---|---|---|---|
| GB | 2561403 A | * | 10/2018 | .......... B81B 3/0081 |
| JP | 6324633 B2 | * | 5/2018 | ..... G01R 31/318513 |
| RU | 2539347 C1 | * | 1/2015 | |
| TW | 201001666 A | | 1/2010 | |
| TW | 201721828 A | | 6/2017 | |
| TW | 201801201 A | | 1/2018 | |
| TW | 202335223 A | * | 9/2023 | .......... H01L 23/481 |
| WO | WO-2012031362 A1 | * | 3/2012 | ..... G01R 31/318555 |
| WO | WO-2019066976 A1 | * | 4/2019 | ......... H01L 23/5223 |
| WO | WO-2022055598 A1 | * | 3/2022 | ............ H01L 21/78 |
| WO | WO-2023028016 A1 | * | 3/2023 | ......... H01L 23/3128 |
| WO | WO-2023121876 A1 | * | 6/2023 | ............. G05F 1/575 |

* cited by examiner

SEMICONDUCTOR PACKAGES AND METHODS OF MANUFACTURING THEREOF

CROSS-REFERENCE TO RELATED APPLICATION

This application claims priority to and the benefit of U.S. Provisional Application No. 63/310,687, filed Feb. 16, 2022, entitled "A MECHANISM TO ELIMINATE THE IMPACT OF IR DROP DUE TO TSV AND POWER DELIVERY NETWORK IN 3DIC INTEGRATION," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more advanced packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
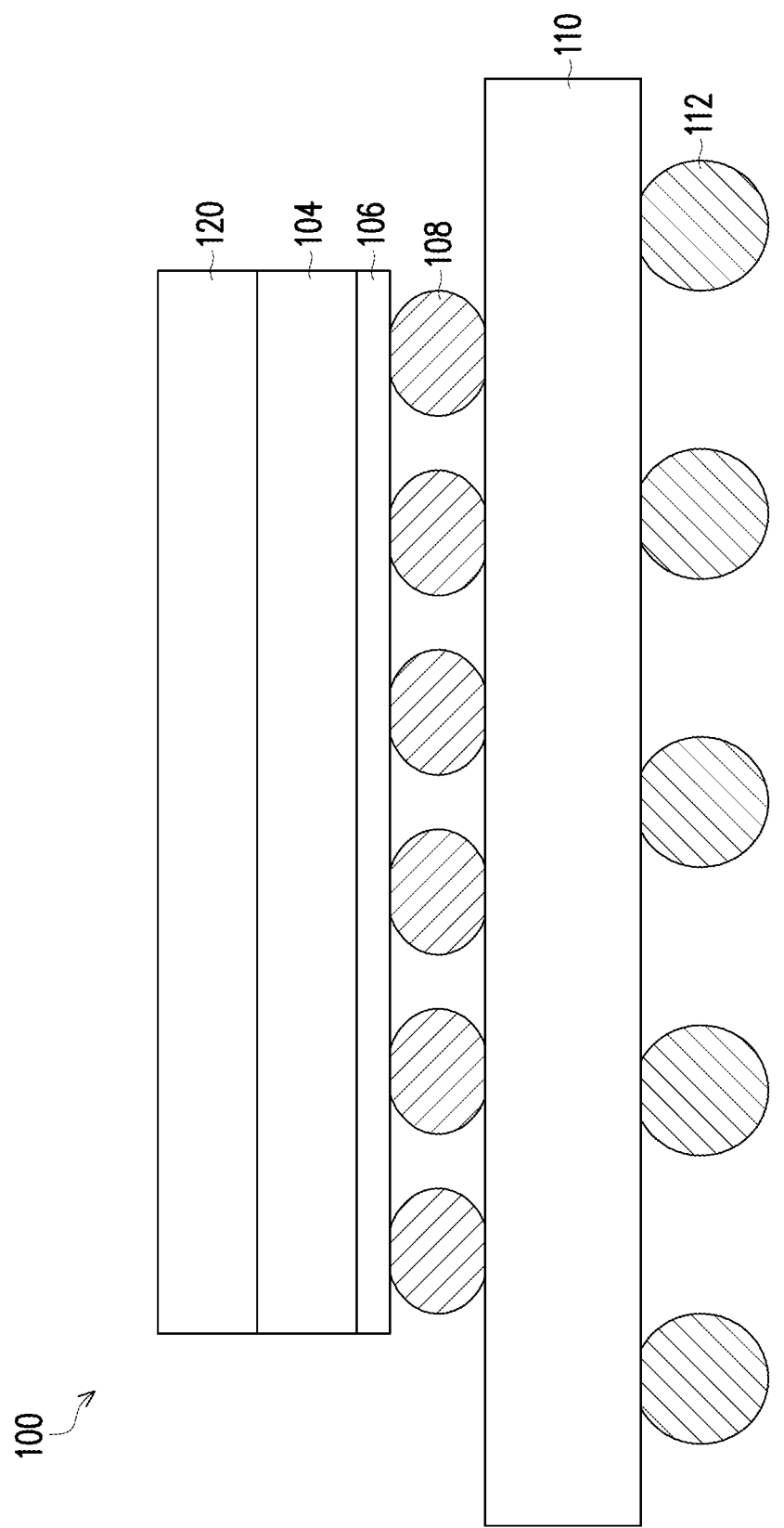
FIG. 1 schematically illustrates a cross-sectional view of an example semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers (substrates), forming respective semiconductor dies. Two or more semiconductor wafers (or dies) may be arranged on top of one another to further reduce the form factor of the semiconductor device.

Two semiconductor wafers or dies (e.g., a bottom die and a top die) may be bonded together through suitable bonding techniques such as, for example, hybrid bonding, microbumps, direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor dies based on a number of through via structures (e.g., through-silicon-vias, through-substrate-vias, or the like).

Such through via structures can be used to deliver power from a package pin, through the bottom die, and to the top die. Further, a voltage regulator is generally utilized to stabilize a signal (e.g., voltage) level of the power received by one or more active circuits formed on the top die. When this voltage regulator is formed on the same die as the active circuits, additional through via structures are commonly needed to propagate the power, which disadvantageously cause additional IR drop on the power. Even forming the existing voltage regulator on a different die (e.g., the bottom die) from the die of the active circuits, the voltage regulator generally receives a feedback signal from the same (e.g., bottom) die (to stabilize the regulated power), which again requires additional through via structures thereby causing undesired IR drop. Thus, the existing voltage regulator of a semiconductor package has not neem entirely satisfactory in many aspects.

The present disclosure provides various embodiments of a semiconductor device or package that includes a voltage regulator configured to provide a regulated power supply directly based on a sensed signal (e.g., voltage) level of the regulated power supply. In various embodiments, the semiconductor device may include a first semiconductor die bonded to a package substrate and a second semiconductor die bonded to the first semiconductor die opposite to the side facing the package substrate. In one aspect of the present disclosure, the voltage regulator, as herein disclosed, may be disposed on the first semiconductor die, with one or more active circuits (sometimes referred to as "loads") disposed on the second semiconductor die. The disclosed voltage regulator can receive a power supply through the package substrate and provide a regulated power supply to the active circuits. Further, the voltage regulator can regulate (e.g., stabilize) the power supply based on its own provided regulated power supply. With such direct sensing on the provided regulated power supply, the power supply signal needs not travel through additional interconnect structures, and thus, a significant amount of IR drop typically observed in the existing technologies can be prevented from being generated.

FIG. 1 illustrates a cross-sectional view of a semiconductor package (or device) 100, in accordance with various embodiments. In one aspect, the semiconductor package 100 may sometimes be referred to as a three-dimensional integrated circuit (3D IC) with two or more levels of multiple semiconductor devices (sometimes referred to as "chips" or "dies") stacked on top of one another. It should be understood that the semiconductor package 100 is simplified for illustrative purposes, and thus, the arrangement of components of the semiconductor package 100 can be configured in various other manners and/or the semiconductor package 100 can include any of other components while remaining within the scope of the present disclosure.

For example, the semiconductor package 100 includes a first (e.g., top) die 102 and a second (e.g., bottom) die 104 stacked on top of one another. The top and bottom dies 102 and 104 may be (e.g., electrically) bonded to each other through suitable bonding techniques such as, for example, hybrid bonding, microbumps, direct bonding, chemically activated bonding, plasma activated bonding, anodic bonding, eutectic bonding, glass frit bonding, adhesive bonding, thermo-compressive bonding, reactive bonding and/or the like.

In one embodiment, the top die 102 may include multiple active circuits/devices/loads such as, for example, a system-on-chip (SoC) device, a high-bandwidth memory device (HBM) device, or the like, while the bottom die 104 may include one or more passive circuits/devices/loads such as, for example, an integrated passive device, an integrated voltage regulator, or the like. In another embodiment, the top die 102 may include both active and passive circuits/devices/loads, and the bottom die 104 may also include both active and passive circuits/devices/loads. In yet another embodiment, the top die 102 may include passive circuits/devices/loads, while the bottom die 104 may also include active circuits/devices/loads.

The semiconductor package 100 further includes a redistribution structure 106 connected to the bottom die 106. It should be appreciated that the illustration of the redistribution structure 106 in FIG. 1 (and the following figures) is schematic. The redistribution structure 106 may include a number of redistribution lines (RDLs), such as metal traces (or metal lines), and vias underlying and connected to the metal traces, which are sometimes referred to as RDL routes. Such RDL routes may later be shown in one or more of the following figures.

In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the RDLs. The patterning forms openings through the photo resist to expose the seed layer. A conductive material is formed in the openings of the photo resist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet and/or dry etching. The remaining portions of the seed layer and conductive material form the RDLs of the redistribution structure 106.

The semiconductor package 100 further includes a number of bumps 108 (e.g., electrically) connecting the redistribution structure 106 to a package substrate 110. The bumps 108 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 108 are C4 bumps. The bumps 108 may be formed by a sputtering, printing, electro plating, electroless plating, CVD, or the like. The bumps 108 may be solder free and have substantially vertical sidewalls. In some embodiments, a metal cap layer (not shown) is formed on the top of the bumps 108. The metal cap layer may include nickel, tin, tin-lead, gold, silver, palladium, indium, nickel-palladium-gold, nickel-gold, the like, or a combination thereof and may be formed by a plating process.

The package substrate 110 may be, e.g., a printed circuit board (PCB) or the like, and may be connected to the intermediate package (e.g., bonded top die 102 and bottom die 104 together with the redistribution structure 106) using the bumps 108. The package substrate 110 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 110 may be a SOI substrate. Generally, an SOI substrate includes a layer of a semiconductor material such as epitaxial silicon, germanium, silicon germanium, SOI, SGOI, or combinations thereof. The package substrate 110 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 110.

The package substrate 110 may include metallization layers and vias, and bond pads over the metallization layers and vias. The metallization layers are designed to connect the various devices to form functional circuitry, which are sometimes referred to as package routes. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). Such package routes may later be shown in one or more of the following figures.

The semiconductor package 100 further includes a number of conductive connectors 112 disposed on a side of the package substrate 110 opposite to its side facing the redistribution structure 106, as shown in FIG. 1. The conductive connectors 112 may be formed from a conductive material such as solder, copper, aluminum, gold, nickel, silver, palladium, tin, the like, or a combination thereof. In some embodiments, the conductive connectors 112 are formed by initially forming a layer of solder through methods such as evaporation, electroplating, printing, solder transfer, ball placement, or the like. Once a layer of solder has been formed on the structure, a reflow may be performed in order to shape the conductive connectors 112 into desired bump shapes. Such conductive connectors 112 can operatively serve as package pins of the semiconductor package 100, for example, configured to receive one or more supply voltages, in some embodiments.

Figure 2:
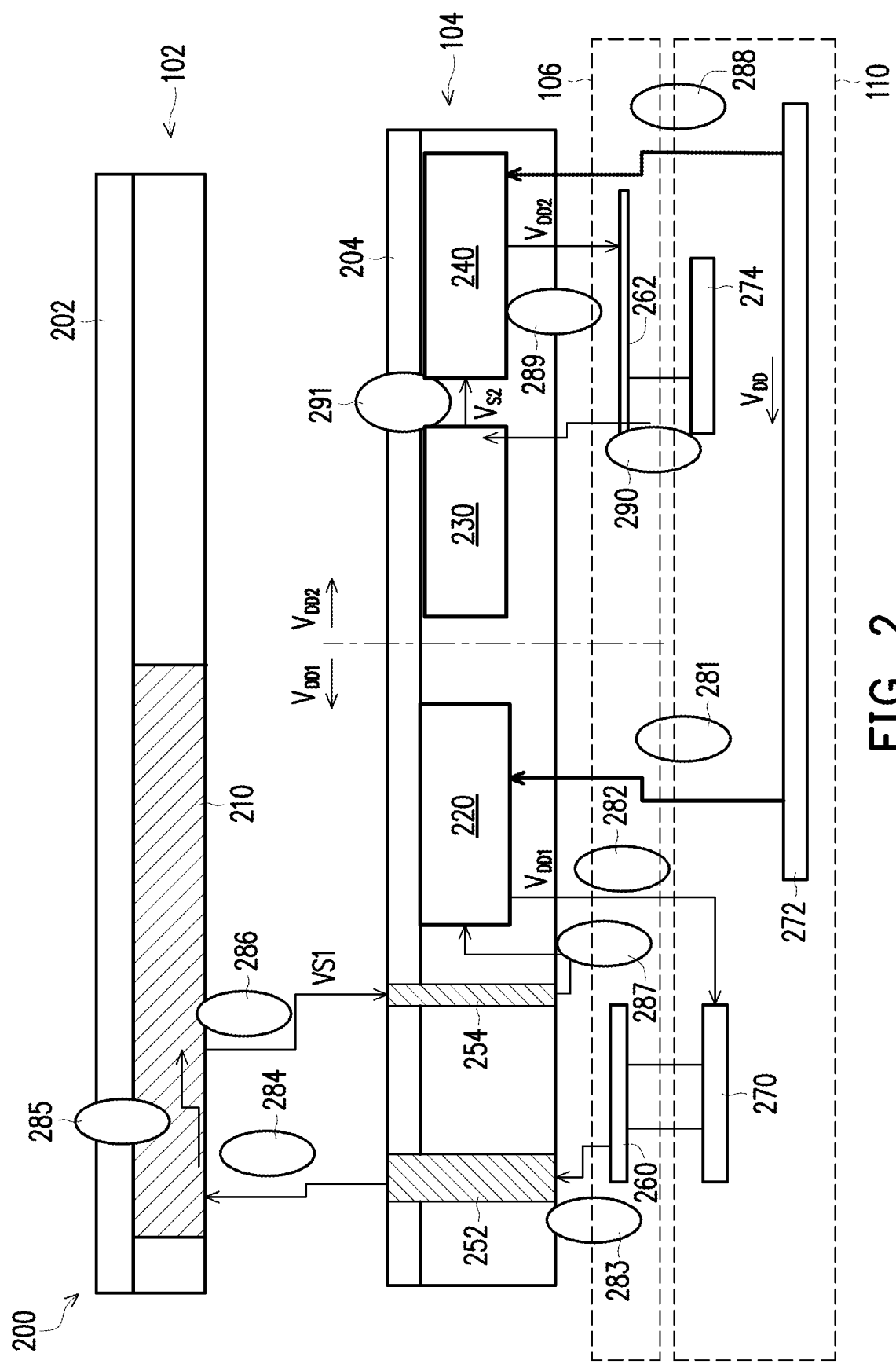
FIG. 2 illustrates a cross-sectional view of an implementation of the semiconductor package of FIG. 1, in accordance with some embodiments.

Referring to FIG. 2, depicted is a cross-sectional view of an example implementation 200 of the semiconductor package 100. The implementation 200 shown in FIG. 2 is merely an example, and thus, it should be understood that the implementation 200 can include any of various other components while remaining within the scope of the present disclosure.

For example, in the implementation 200, the top die 102 includes a substrate 202 and a load 210 disposed on the substrate 202. The bottom die 104 includes a substrate 204, a load 230, and voltage regulators 220 and 240 disposed on the substrate 204. Each of the loads 210 and 230 may be implemented as a respective device (e.g., an SOC device, a memory device, a power device, etc.) with one or more certain functions. In some embodiments, the top die 102 and bottom die 104 are arranged (e.g., stacked) with each other based on a front-to-back (F2B) manner. That is, the top die 102 has its frontside facing or bonding to a backside of the bottom die 104. It should be appreciated that the top and bottom dies can be arranged in other manners (e.g., a back-to-back (B2B) manner), while remaining within the scope of the present disclosure. Further, the bottom die 104 includes a number of through via structures 252 and 254 extending through the bottom die 104 (or at least the substrate 204). The redistribution structure 106 includes a number of RDL routes (e.g., formed as metal traces and/or vias) 260 and 262. The package substrate 110 includes a number of package routes (e.g., formed as metallization layers) 270, 272, and 274.

In various embodiments, the voltage regulators 220 and 240 may each include a low-dropout (LDO) regulator. In general, a LDO regulator is configured to provide a well-specified and stable direct-current (DC) output voltage (e.g., a regulated output voltage) based on an input voltage (e.g., an unregulated input voltage) with a low dropout voltage. The "dropout voltage" used herein typically refers to a minimum voltage required across the LDO regulator to maintain the output voltage being regulated. Even though the input voltage, provided by a power source, falls to a level very near that of the output voltage and is unregulated, the LDO regulator can still produce the output voltage that is regulated and stable. Such a stable characteristic enables the LDO regulator to be used in a variety of integrated circuits (ICs), for example, a memory device, an SOC device, etc.

In various embodiments, the package route 272 can receive a supply voltage (e.g., VDD, VSS) through a package pin, and the voltage regulator 220 and 240 can receive such a supply voltage, VDD, and output regulated supply voltage $V_{DD1}$ and $V_{DD2}$ to the loads 210 and 230, respectively. $V_{DD1}$ and $V_{DD2}$ may be in different voltage domains, in some implementations. For example, $V_{DD1}$ and $V_{DD2}$ may be adopted by respective circuits or loads that have different functions.

Upon receiving the $V_{DD}$ through the package route 272 as an input, the voltage regulator 220 may output the $V_{DD1}$ to the load 210 through the package route 270, the RDL route 260, and the through via structure 252. As such, the through via structure 252 may sometimes be referred to as a power through via structure. Further, the voltage regulator 220 can regulate or otherwise stabilize the $V_{DD1}$ based on a reference voltage (not shown) and a voltage ($V_{S1}$) sensed directly from the load 210, which may be received by a differential amplifier of the voltage regulator 220 as inputs. Specifically, the voltage regulator 220 can receive the $V_{S1}$ through the through via structure 254. As such, the through via structure 254 may sometimes be referred to as a signal through via structure. In accordance with various embodiments, the signal through via structure may be formed in a smaller dimension than the power through via structure. For example, the signal through via structure may have a smaller diameter than the power through via structure.

In other words, a regulated supply voltage received by the load 210 may include a number of paths, for example, path 281 from the package route 272 to the voltage regulator 220, path 282 from the voltage regulator 220 to the package route 270, path 283 from the RDL route 260 to the power through via structure 252, path 284 from the power through via structure 252 to the load 210, path 285 along local routes of the load 210, (feedback) path 286 from the load 210 to the signal through via structure 254, and (feedback) path 287 from the signal through via structure 254 to the voltage regulator 220.

In some embodiments, the $V_{S1}$ may be sensed through a first pin of the load 210 that is electrically coupled or integrated to a second pin of the load 210 that receives the regulated voltage $V_{DD1}$, which causes a current flowing through the signal through via structure 254 to be substantially close to zero. As such, there is essentially no IR drop present on the signal through via structure 254. Further, any IR drop present along the path delivering the regulated supply voltage (e.g., the IR drop accumulated from the paths 283 to 291) can be absorbed by the voltage regulator 220. For instance, the IR drop induced along at least one of the paths 283 to 291 (which may be presented as residue IR drop variation) can be forcibly pulled to the same voltage level as the reference voltage received by the amplifier of the voltage regulator 220. As a non-limiting example, for a certain technology node, a total IR drop accumulated across the paths 283 to 291 may be in the range of about 20 millivolts (mV) to about 40 mV. However, by tying the $V_{S1}$ through the signal through via structure 254 to the voltage regulator 220, the total IR drop can be pulled down to about 5 mV to about 10 mV (or about 2 to 4 times less).

As a comparison, when a load and voltage regulator are disposed on the same die, the voltage regulator may be able to pick up (or sense) a regulated supply voltage (to the load). For example in FIG. 2, upon receiving the VDD received through the package route 272 as an input, the voltage regulator 240 may output the $V_{DD2}$ to the load 230 through the RDL route 262 and package route 274. Further, the voltage regulator 240 can regulate the $V_{DD2}$ based on a reference voltage (not shown) and a voltage ($V_{S2}$) sensed directly from the load 230, which may be received a differential amplifier of the voltage regulator 240 as inputs. In other words, a regulated supply voltage received by the load 230 may include path 288 from the package route 272 to the voltage regulator 240, path 289 from the voltage regulator 240 to the RDL route 262, path 290 from the RDL route 262 to the load 230, and (feedback) path 291 from the load 230 to the voltage regulator 240.

Figure 3:
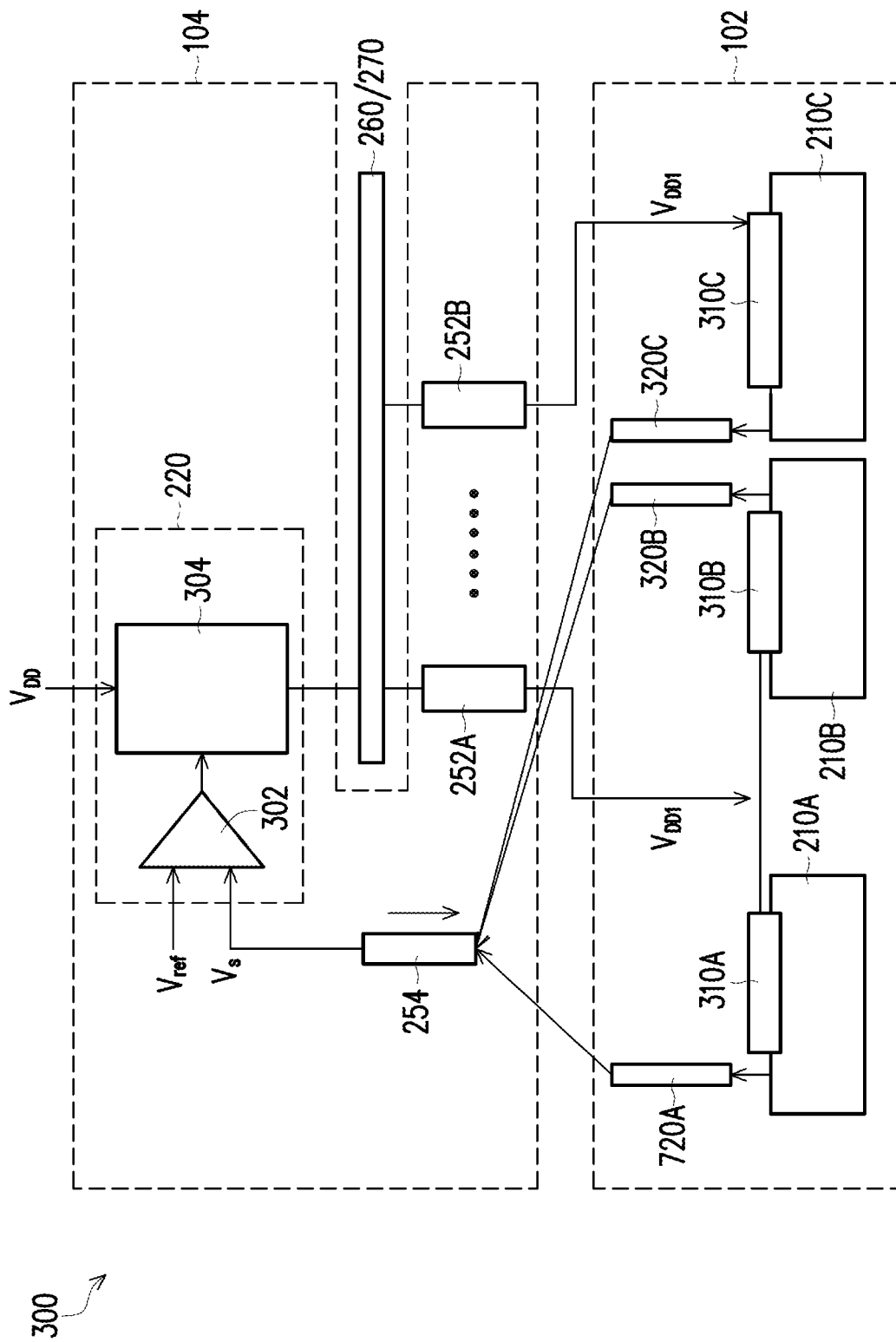
FIG. 3 illustrates a cross-sectional view of another implementation of the semiconductor package of FIG. 1 in accordance with some embodiments.

Referring to FIG. 3, depicted is a cross-sectional view of another example implementation 300 of the semiconductor package 100. In some embodiments, the implementation 300 is substantially similar to the implementation 200 except that the voltage regulator 220 disposed on the bottom die 104 can provide multiple loads on the top die 102 with a regulated supply voltage based on a lumped sensed voltage. Accordingly, some of the reference numerals of FIG. 2 may be reused in FIG. 3. The implementation 300 shown in FIG. 3 is merely an example, and thus, it should be understood that the implementation 300 can include any of various other components while remaining within the scope of the present disclosure.

For example, the voltage regulator 220, which includes a (e.g., differential) amplifier 302 and a power transistor (e.g., a p-type transistor) 304, regulates the supply voltage, VDD, and outputs the regulated supply voltage, $V_{DD1}$, to a number of different loads (e.g., 210A, 210B, and 210C) through at least the package route 270, RDL route 260, and a number of power through via structures (e.g., 252A and 252B). The amplifier 302 can regulate the voltage VDD based on reference voltage, $V_{ref}$ (e.g., a bandgap voltage reference), and voltage, $V_S$ (sensed from the loads 210A to 210C through the signal through via structure 254).

For example, the amplifier 302 has a first input and second input (e.g., a non-inverting input terminal and an inverting input terminal) that receives the $V_{ref}$ and $V_S$, respectively. The amplifier 302 has an output coupled to the power transistor 304 that functions as a standby current source to provide a standby current charging a capacitor (not shown). The standby current charges the capacitor to establish the regulated supply voltage $V_{DD1}$ at its output. The output voltage $V_{DD1}$ is controlled based on the reference voltage $V_{ref}$ and sensed voltage $V_S$. More specifically, when the voltage level of $V_{DD1}$ is relatively high, an error voltage (i.e., a product of gain of the amplifier 302 and difference between the reference voltage $V_{ref}$ and the sensed voltage $V_S$) received by the gate of the transistor 304 proportionally increases. The increase in the error voltage reduces source-gate voltage ($V_{sg}$) of the transistor 304, which causes a decrease in the standby current. As a result, the voltage level of $V_{DD1}$ decreases. Through an opposite mechanism, a relatively low output voltage level pulls down the error voltage, then increases the standby current, and in turn increases the voltage level of $V_{DD1}$. In other words, the voltage regulator 220 is configured to control the voltage level of $V_{DD1}$ to be at a substantially stable value, and such a stable value is controlled to be close to the voltage level of the reference voltage $V_{ref}$.

Further, the loads 210A to 210C receive the regulated supply voltage $V_{DD1}$ through their respective local routes 310A, 310B, and 310C, and provide different portions of the sensed voltage $V_S$ through their local routes 320A, 320B, and 320C, respectively. In some embodiments, the routes 320A to 320C may have substantially similar dimensions (e.g., lengths). As such, the sensed voltage $V_S$ may be a lumped (e.g., averaged) signal of those portions sensed from the different loads 210A to 210C, respectively. In some other embodiments, the dimensions of the routes 320A to 320C may be different, which allows the sensed voltage $V_S$ to have different weighting on the portions sensed from the different loads 210A to 210C, respectively.

Still further, according to some embodiments of the present disclosure, the voltage regulator 220 can receive the sensed voltage $V_S$ through one or more signal through via structures in various forms. For example, the voltage regulator 220 can receive the sensed voltage $V_S$, as a lumped voltage level, from multiple loads through a single signal through via structure, as shown in FIG. 3. In another example, the voltage regulator 220 can receive the sensed voltage $V_S$ as a lumped digital code (e.g., having a number of bits corresponding to the number of loads, respectively), when the voltage regulator 220 is implemented as a digitally controlled LDO regulator. Specifically, a time-to-digital (TDC) or digital-to-time (DTC) ring oscillator may be disposed on the top die 102 that can provide respective bits based on the portions sensed from the different loads 210A to 210C. In such an implementation, the ring oscillator can provide the bits to the digitally controlled LDO regulator through multiple through signal vias, which correspond to the different loads 210A to 210C, respectively.

Figure 4:
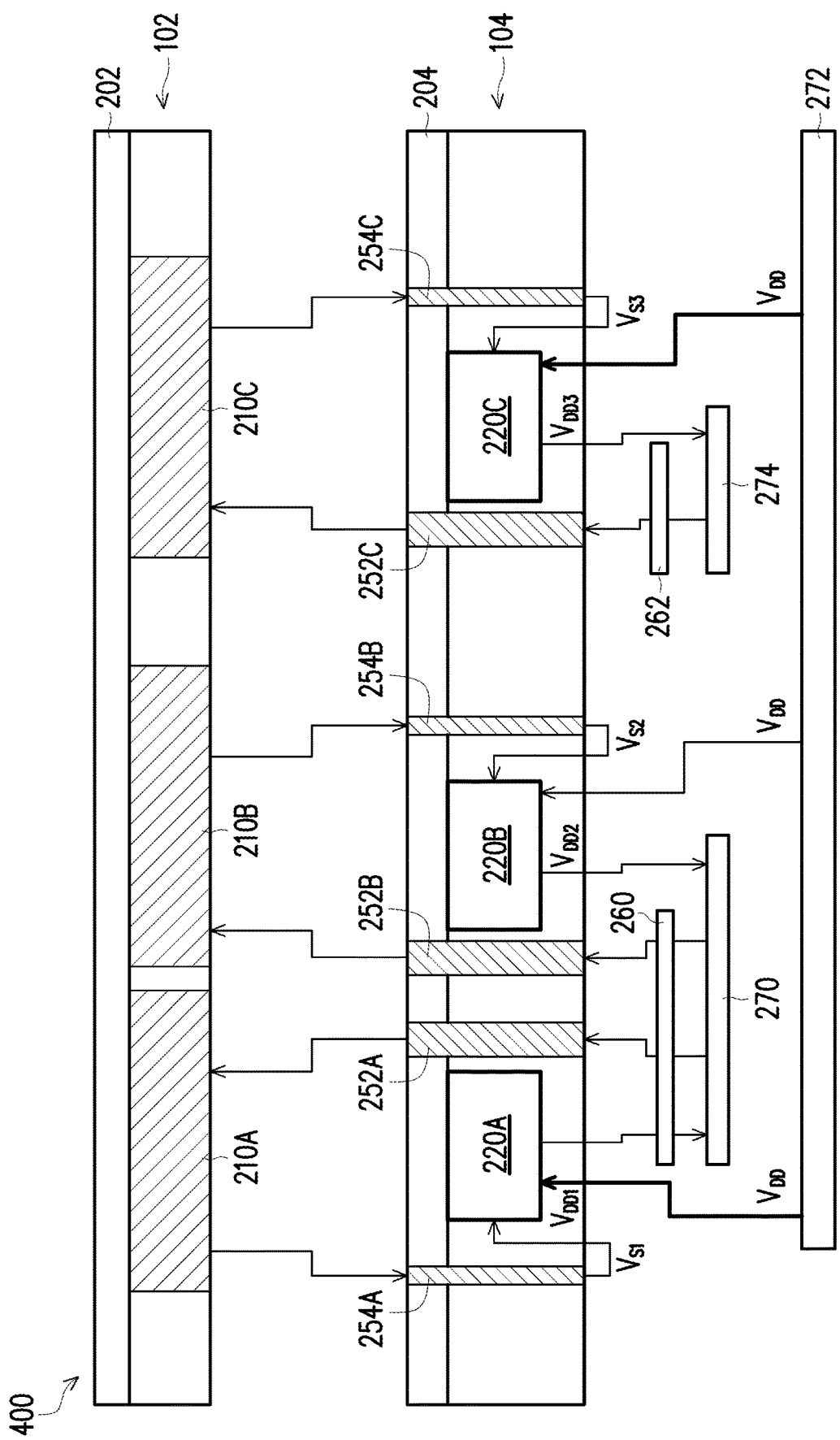
FIG. 4 illustrates a cross-sectional view of yet another implementation of the semiconductor package of FIG. 1, in accordance with some embodiments.

Referring to FIG. 4, depicted is a cross-sectional view of yet another example implementation 400 of the semiconductor package 100. In some embodiments, the implementation 400 is substantially similar to the implementation 200 except that the implementation 400 includes different voltage regulators, 220A, 220B, and 220C all disposed on the bottom die 104 but each provide a regulated supply voltage to a corresponding one of multiple loads disposed on the top die 102 based on a respective sensed voltage. Accordingly, some of the reference numerals of FIG. 2 may be reused in FIG. 4. The implementation 400 shown in FIG. 4 is merely an example, and thus, it should be understood that the implementation 400 can include any of various other components while remaining within the scope of the present disclosure.

For example, the voltage regulator 220A can receive the supply voltage VDD through one or more corresponding package routes (e.g., 272), and provide a regulated supply voltage $V_{DD1}$ to the load 210A based on a sensed voltage $V_{S1}$; the voltage regulator 220B can receive the supply voltage VDD through one or more corresponding package routes, and provide a regulated supply voltage $V_{DD2}$ to the load 210B based on a sensed voltage $V_{S2}$; and the voltage regulator 220C can receive the supply voltage VDD through one or more corresponding package routes, and provide a regulated supply voltage $VDD_3$ to the load 210C based on a sensed voltage $VS_3$. In various embodiments, the voltage regulator 220C may serve as dedicated or single regulator for the load 210C, while the 220A and 220B may serve as respective or distributed portions of a relatively big regulator formed on the bottom die 104 for multiple loads 210A and 210B.

Further, the voltage regulators can provide the regulated supply voltages through respective power through via structures (and one or more package routes and RDL routes), and receive the sensed voltages through respective signal through via structures. For example, the voltage regulator 220A can send the regulated supply voltage $V_{DD1}$ to the load 210A through one or more package/RDL routes (e.g., 270, 260, etc.) and a power through via structure 252A, and receive the sensed voltage $V_{S1}$ through a signal through via structure 254A; the voltage regulator 220B can send the regulated supply voltage VDD' to the load 210B through one or more package/RDL routes (e.g., 270, 260, etc.) and a power through via structure 252B, and receive the sensed voltage $V_{S2}$ through a signal through via structure 254B; and the voltage regulator 220C can send the regulated supply voltage $VDD_3$ to the load 210C through package/RDL routes (e.g., 274, 262, etc.) and a power through via structure 252C, and receive the sensed voltage $V_{S3}$ through a signal through via structure 254C.

Referring to FIGS. 5, 6, 7, and 8, depicted are cross-sectional views of various other example implementations 500, 600, 700, and 800 of the semiconductor package 100, respectively. In some embodiments, each of the implementations 500 to 800 has certain components substantially similar to the implementation 200. Accordingly, some of the reference numerals of FIG. 2 may be reused in FIG. 5 to FIG. 8. The implementations 500 to 800 shown in FIGS. 5 to 8, respectively, are merely examples, and thus, it should be understood that the implementations 500 to 800 can each include any of various other components while remaining within the scope of the present disclosure.

Figure 5:
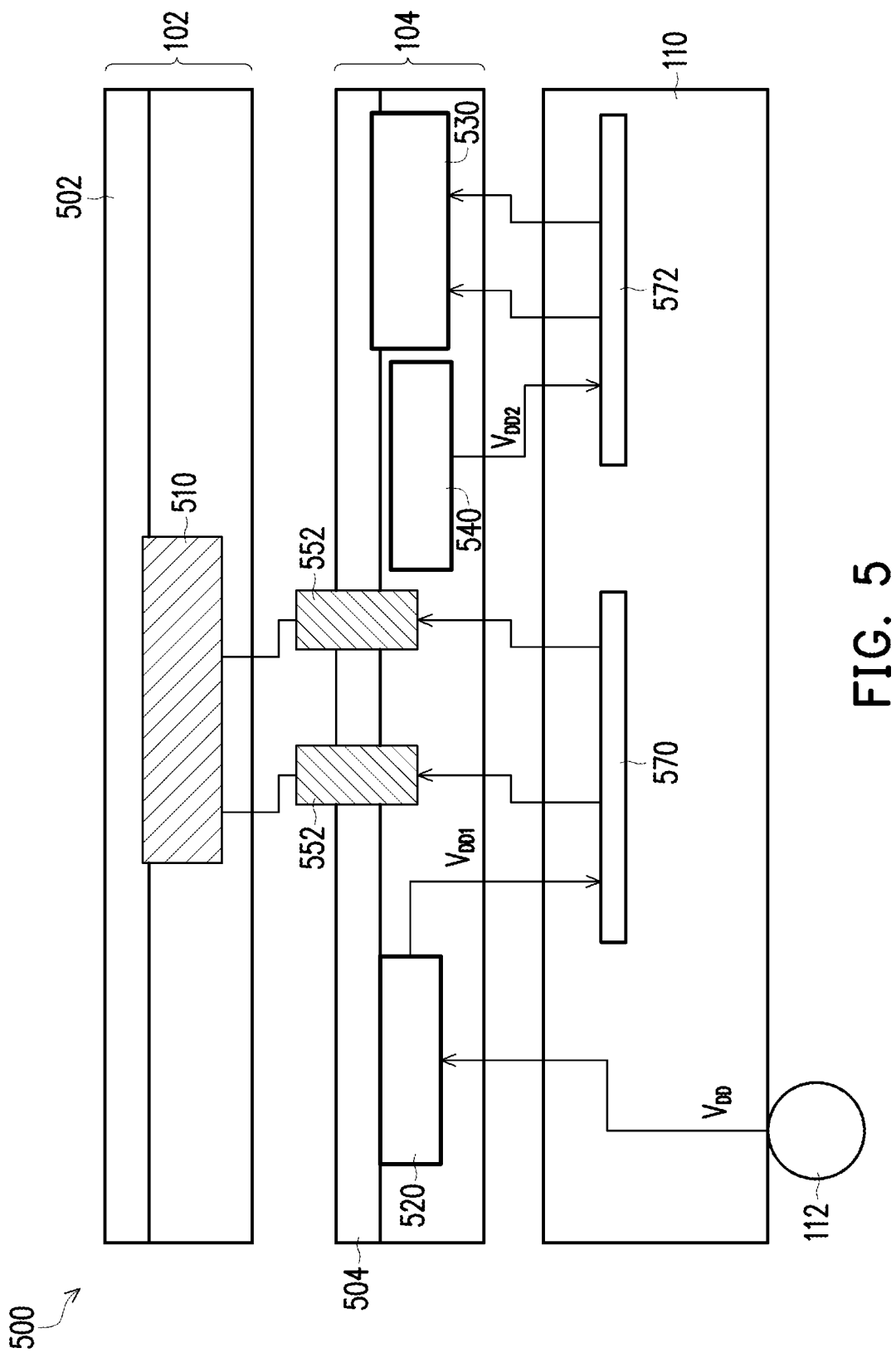
FIGS. 5, 6, 7, and 8 illustrate cross-sectional views of various other implementations of the semiconductor package of FIG. 1, respectively, in accordance with some embodiments.

Referring first to FIG. 5, the implementation 500 includes the top die 102 and bottom die 104 bonded to each other in a F2B manner (the frontside of a substrate 502 facing the backside of a substrate 504), which are further bonded to the package substrate 110. The bottom die 104 includes a voltage regulator 520 configured to receive a supply voltage VDD through the connector 112, and to provide a regulated supply voltage $V_{DD1}$ to a load 510 disposed on the top die 102 through a package route 570 and then one or more power through via structures 552. The bottom die 104 further includes another voltage regulator 540 configured to provide a regulated supply voltage $V_{DD2}$ to a load 530 also disposed in the same die 104 through another package route 572. In various embodiments, the voltage regulator 520 can provide the regulated voltage $V_{DD1}$ based on a reference voltage (e.g., $V_{ref}$) and a voltage (e.g., $V_S$) directly sensed from the load 510 and received through a signal through via structure (e.g., 254 of FIG. 2).

Figure 6:
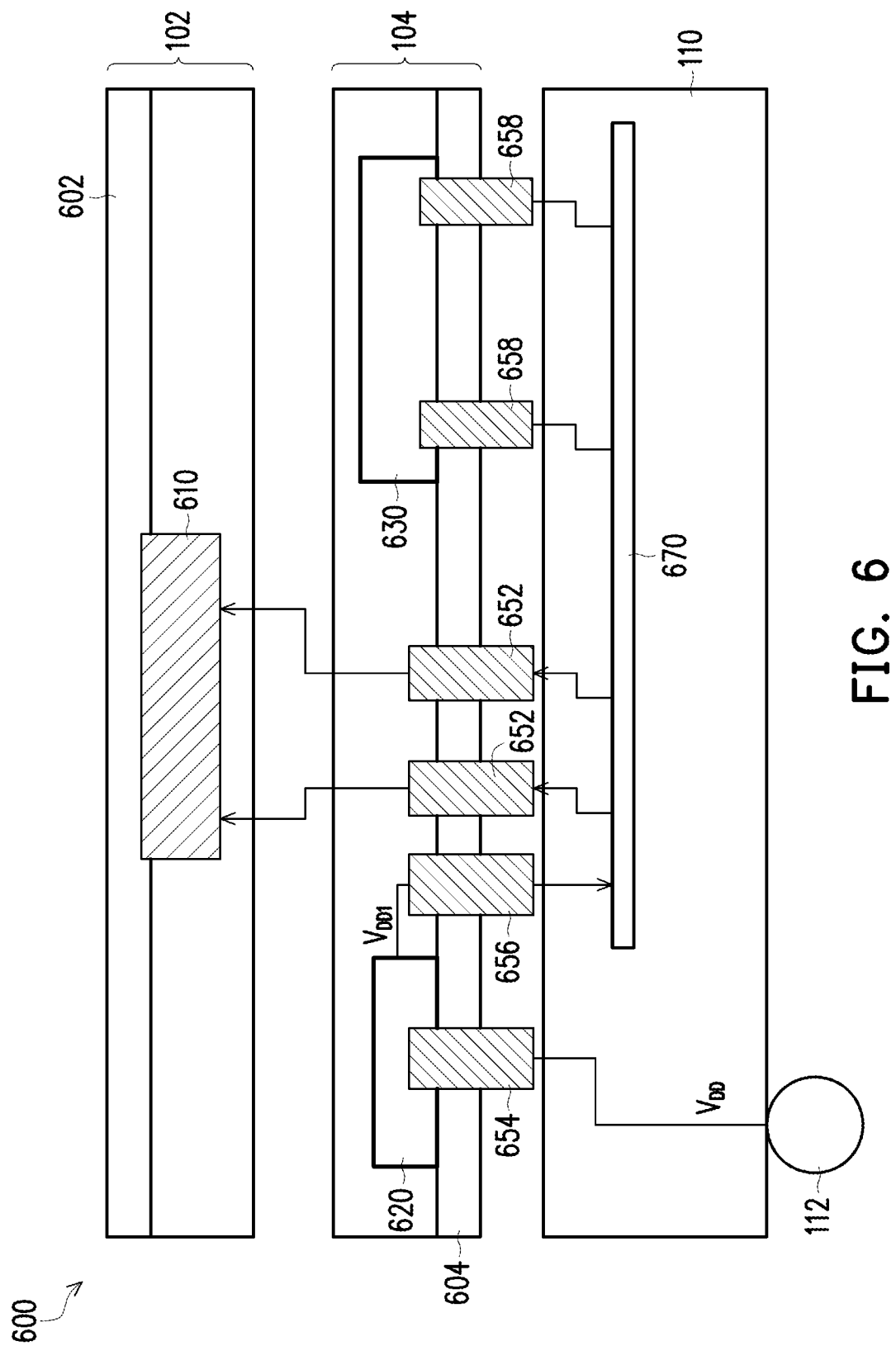

Referring next to FIG. 6, the implementation 600 includes the top die 102 and bottom die 104 bonded to each other in a F2F manner (the frontside of a substrate 602 facing the backside of a substrate 604), which are further bonded to the package substrate 110. The bottom die 104 includes a voltage regulator 620 configured to receive a supply voltage VDD through the connector 112 and a power through via structure 654, and to provide a regulated supply voltage $V_{DD1}$ to a load 610 disposed on the top die 102 through another power through via structure 656, a package route 570 and then one or more power through via structures 652. The bottom die 104 further includes another load 630 configured to receive the regulated supply voltage $V_{DD1}$ through the package route 670 and one or more power through via structures 658. In various embodiments, the voltage regulator 620 can provide the regulated voltage $V_{DD1}$ based on a reference voltage (e.g., $V_{ref}$) and a voltage (e.g., $V_S$) directly sensed from the load 610 and received through a signal through via structure (e.g., 254 of FIG. 2) and/or directly sensed from the load 630.

Figure 7:
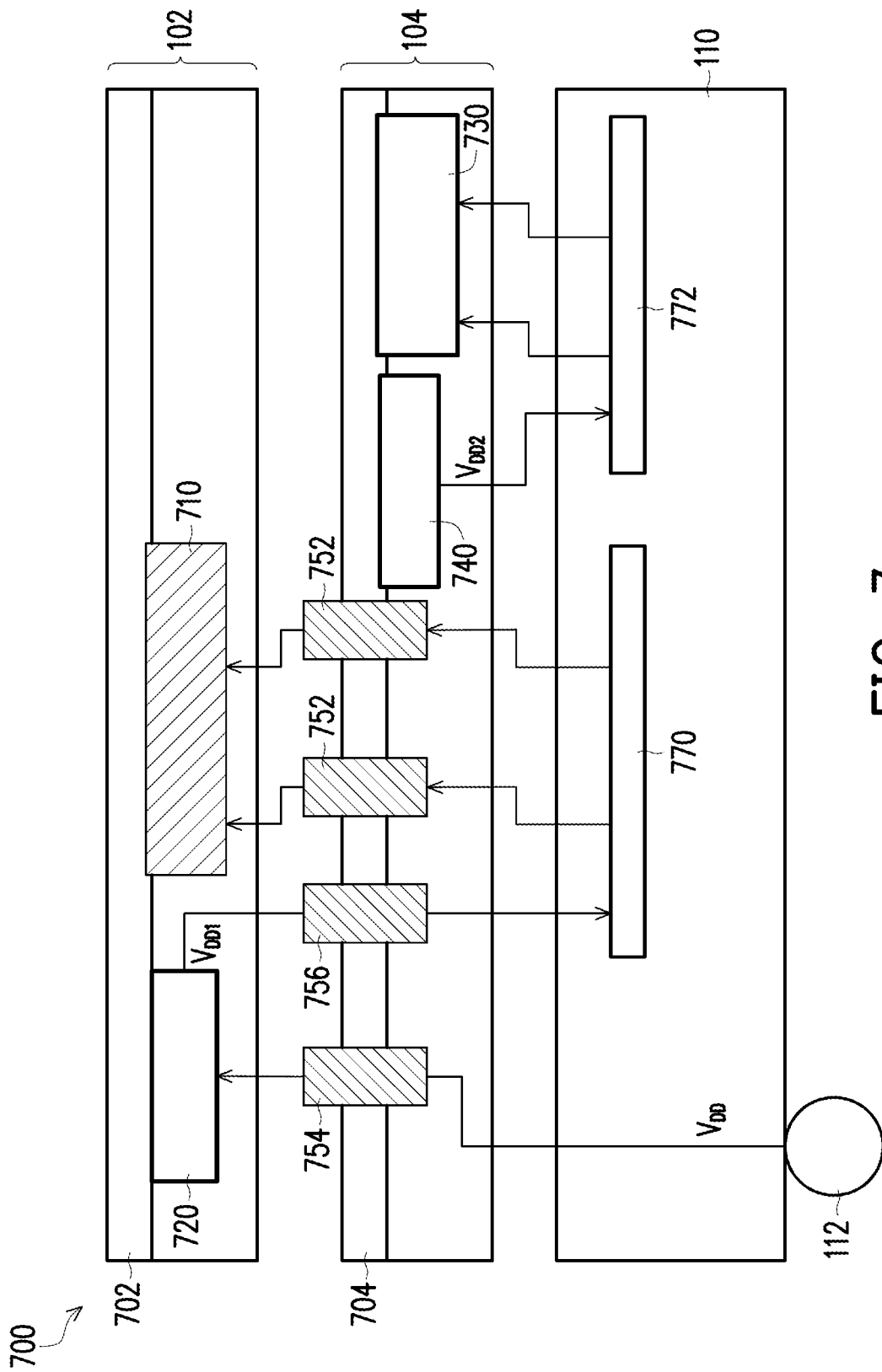

Referring next to FIG. 7, the implementation 700 includes the top die 102 and bottom die 104 bonded to each other in a F2B manner (the frontside of a substrate 702 facing the backside of a substrate 704), which are further bonded to the package substrate 110. The top die 102 includes a voltage regulator 720 configured to receive a supply voltage VDD through the connector 112 and a power through via structure 754, and to provide a regulated supply voltage $V_{DD1}$ to a load 710 disposed on the same top die 102 through a power through via structure 756, a package route 770 and then one or more power through via structures 752. The bottom die 104 includes a voltage regulator 740 configured to provide a regulated supply voltage $V_{DD2}$ to a load 730 also disposed in the same die 104 through another package route 772. In various embodiments, the voltage regulator 720/740 can provide the regulated voltage $V_{DD1}/V_{DD2}$ based on a reference voltage (e.g., $V_{ref}$) and a voltage (e.g., $V_S$) directly sensed from the load 710/730 (that is, not through a signal through via structure).

Figure 8:
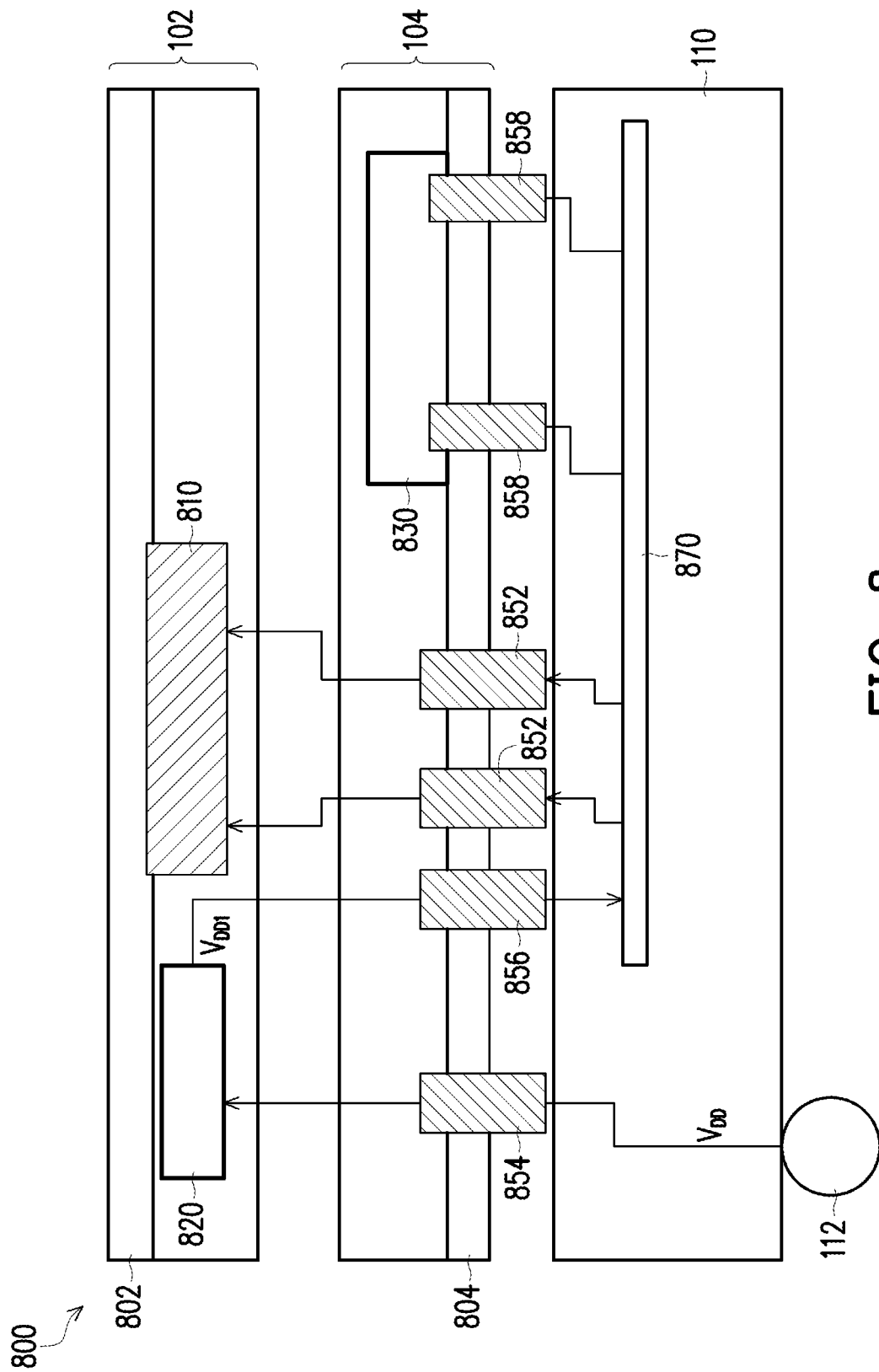

Referring first to FIG. 8, the implementation 800 includes the top die 102 and bottom die 104 bonded to each other in a F2F manner (the frontside of a substrate 802 facing the backside of a substrate 804), which are further bonded to the package substrate 110. The top die 102 includes a voltage regulator 820 configured to receive a supply voltage VDD through the connector 112 and a power through via structure 854, and to provide a regulated supply voltage $V_{DD1}$ to a load 810 disposed on the same top die 102 through a power through via structure 856, a package route 870 and then one or more power through via structures 852. The bottom die 104 further includes another load 830 configured to receive the regulated supply voltage $V_{DD1}$ through the package route 870 and one or more power through via structures 858. In various embodiments, the voltage regulator 820 can provide the regulated voltage $V_{DD1}$ based on a reference voltage (e.g., $V_{ref}$) and a voltage (e.g., $V_S$) directly sensed from the load 810 (that is, not through a signal through via structure).

Figure 9:
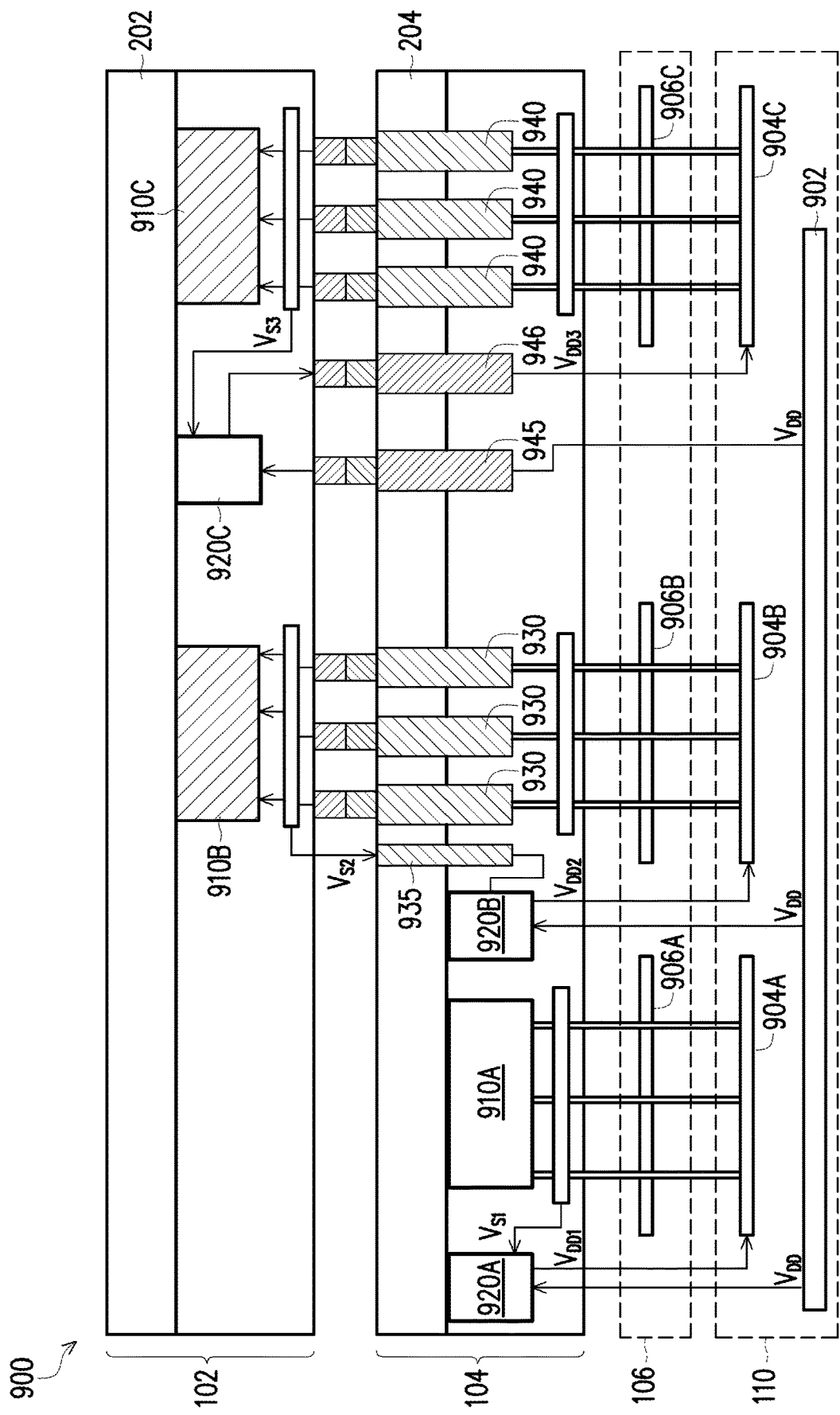
FIG. 9 illustrates a cross-sectional view of yet another implementation of the semiconductor package of FIG. 1, in accordance with some embodiments.

Referring to FIG. 9, depicted is a cross-sectional view of yet another example implementation 900 of the semiconductor package 100. In some embodiments, the implementation 900 is substantially similar to the implementation 200 except that the implementation 900 includes multiple voltage regulators 920A, 920B, and 920C each configured to provide a regulated supply voltage (in a respective voltage domain) to a corresponding load, and each disposed on a die which is the same as or different from a die where the corresponding load is disposed. Accordingly, some of the reference numerals of FIG. 2 may be reused in FIG. 9. The implementation 900 shown in FIG. 9 is merely an example, and thus, it should be understood that the implementation 900 can include any of various other components while remaining within the scope of the present disclosure.

For example, the voltage regulator 920A can receive the supply voltage VDD through one or more corresponding package routes (e.g., 902), and provide a regulated supply voltage $V_{DD1}$ to the load 910A based on a sensed voltage $V_{S1}$; the voltage regulator 920B can receive the supply voltage VDD through one or more corresponding package routes (e.g., 902), and provide a regulated supply voltage $V_{DD2}$ to the load 910B based on a sensed voltage $V_{S2}$; and the voltage regulator 920C can receive the supply voltage VDD through one or more corresponding package routes (e.g., 902) and a power through via structure 945, and provide a regulated supply voltage $VDD_3$ to the load 910C based on a sensed voltage $V_{S3}$. In various embodiments, the voltage regulator 920A and the load 910A may be formed in the same bottom die 104; the voltage regulator 920B and the load 910B may be formed in the bottom die 104 and top die 102, respectively; and the voltage regulator 920C and the load 910C may be formed in the same top die 102.

Further, the voltage regulators can provide the regulated supply voltages through respective power through via structures and/or through one or more package routes and RDL routes, and receive the sensed voltages through respective signal through via structures or through one or more local routes. For example, the voltage regulator 920A can send the regulated supply voltage $V_{DD1}$ to the load 910A through one or more package/RDL routes (e.g., 904A, 906A, etc.), and receive the sensed voltage $V_{S1}$ through one or more local routes on the bottom die 104; the voltage regulator 920B can send the regulated supply voltage $V_{DD2}$ to the load 910B through one or more package/RDL routes (e.g., 904B, 906B, etc.) and a number of power through via structures 930, and receive the sensed voltage $V_{S2}$ through a signal through via structure 935; and the voltage regulator 920C can send the regulated supply voltage $VDD_3$ to the load 210C through a power through via structure 946, package/RDL routes (e.g., 904C, 906C, etc.), and a number of power through via structures 940, and receive the sensed voltage $V_{S3}$ through one or more local routes on the top die 102.

Figure 10:
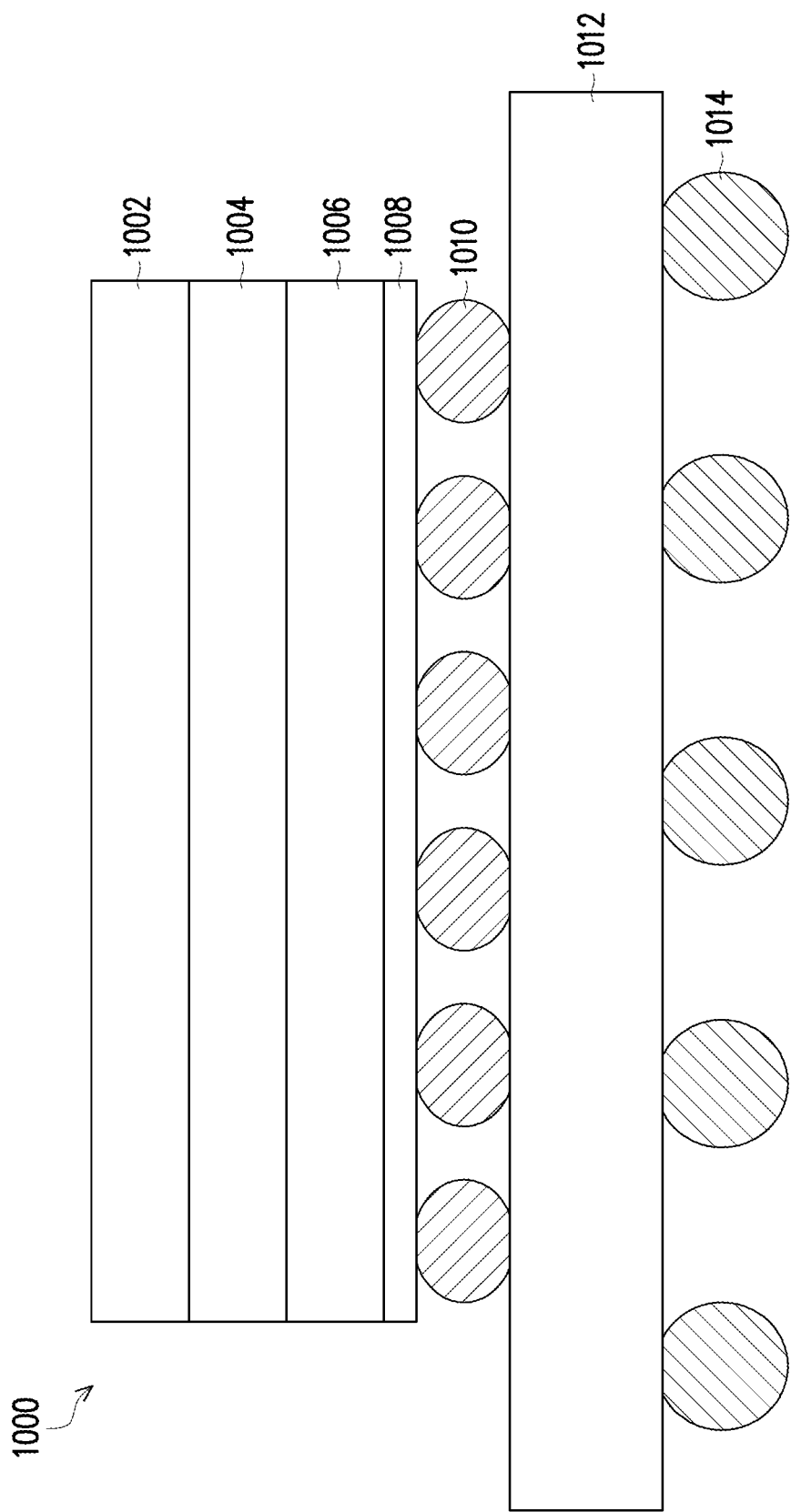
FIG. 10 schematically illustrates a cross-sectional view of another example semiconductor package, in accordance with some embodiments.

FIG. 10 illustrates a cross-sectional view of another semiconductor package (or device) 1000, in accordance with various embodiments. The semiconductor package 1000 may be substantially similar to the semiconductor package 100. For example, the semiconductor package 1000 may also include a three-dimensional integrated circuit (3D IC) with multiple levels of multiple semiconductor devices (sometimes referred to as "chips" or "dies") stacked on top of one another. Different from the semiconductor package 100, the semiconductor package 1000 may include three levels of dies stacked on top of one another. It should be understood that the semiconductor package 1000 is simplified for illustrative purposes, and thus, the arrangement of components of the semiconductor package 1000 can be configured in various other manners and/or the semiconductor package 1000 can include any of other components while remaining within the scope of the present disclosure.

For example, the semiconductor package 1000 includes a first (e.g., top) die 1002, a second (e.g., middle) die 1004, and a third (e.g., bottom) die 1006 stacked on top of one another. The top, middle, and bottom dies 1002 to 1006 may be (e.g., electrically) bonded to each other through suitable bonding techniques such as, for example, hybrid bonding, microbumps, direct bonding, chemically activated bonding, plasma activated bonding, anodic bonding, eutectic bonding, glass fit bonding, adhesive bonding, thermo-compressive bonding, reactive bonding and/or the like. Each of the dies 1002 to 1006 may include one or more active circuits/devices/loads and/or one or more passive circuits/devices/loads.

Similar to the semiconductor package 100, the semiconductor package 1000 also includes a redistribution structure 1008 connected to the bottom die 1006. The redistribution structure 1008 may include a number of redistribution lines (RDLs), such as metal traces (or metal lines), and vias underlying and connected to the metal traces, which are sometimes referred to as RDL routes. Such RDL routes may later be shown in one or more of the following figures. The semiconductor package 1000 also includes a number of bumps 1010 (e.g., electrically) connecting the redistribution structure 1008 to a package substrate 1012. The bumps 1010 may be metal pillars, controlled collapse chip connection (C4) bumps, micro bumps, electroless nickel-electroless palladium-immersion gold technique (ENEPIG) formed bumps, ball grid array (BGA) bumps, or the like. The package substrate 1012 may be, e.g., a printed circuit board (PCB) or the like, and may be connected to the intermediate package using the bumps 1010. The package substrate 1012 may include metallization layers and vias, and bond pads over the metallization layers and vias. The metallization layers are designed to connect the various devices to form functional circuitry, which are sometimes referred to as package routes. The semiconductor package 1000 also includes a number of conductive connectors 1014 disposed on a side of the package substrate 1012 opposite to its side facing the redistribution structure 1008, as shown in FIG. 10. Such conductive connectors 1014 can operatively serve as package pins of the semiconductor package 1000, for example, configured to receive one or more supply voltages, in some embodiments.

Figure 11:
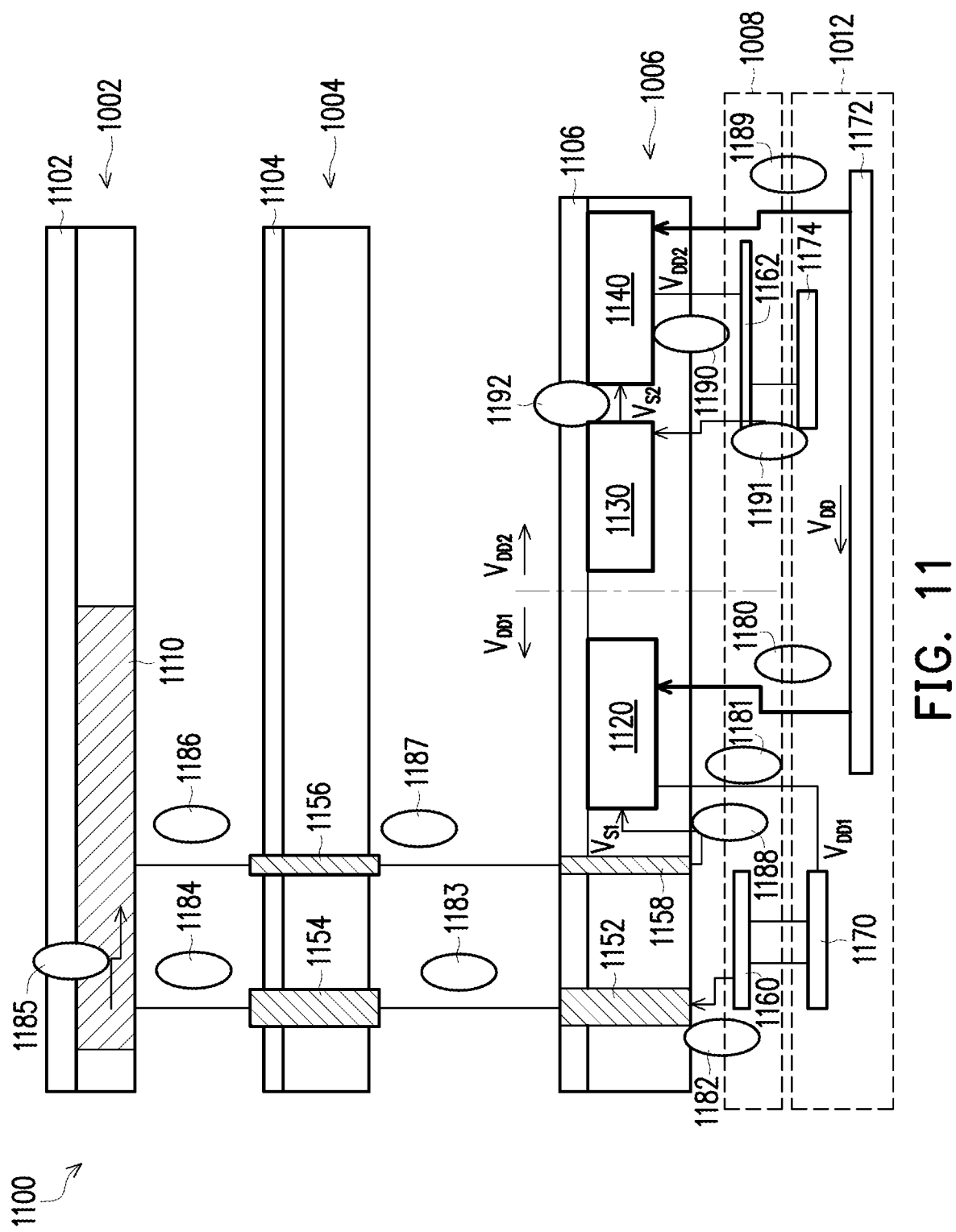
FIG. 11 illustrates a cross-sectional view of an implementation of the semiconductor package of FIG. 10, in accordance with some embodiments.

Referring to FIG. 11, depicted is a cross-sectional view of an example implementation 1100 of the semiconductor package 1000. The implementation 1100 shown in FIG. 11 is merely an example, and thus, it should be understood that the implementation 1100 can include any of various other components while remaining within the scope of the present disclosure. It should also be noted that the implementation 1100 is substantially similar to the implementation 200 of FIG. 2, and thus, the following discussion should be focused on the difference (e.g., the middle die interposed between the top and bottom dies).

For example, in the implementation 1100, the top die 1002 includes a substrate 1102 and a load 1110 disposed on the substrate 1102. The middle die 1004 includes a substrate 1104. The bottom die 1006 includes a substrate 1106, a load 1130, and voltage regulators 1120 and 1140 disposed on the substrate 1106. Each of the loads 1110 and 1130 may be implemented as a respective device (e.g., an SOC device, a memory device, a power device, etc.) with one or more certain functions. As shown, the dies 1002 to 1006 are arranged (e.g., stacked) with each other based on a front-to-back (F2B) manner, although the dies 1002 to 1006 can also be arranged in a F2F manner while remaining within the scope of the present disclosure. Similar to the implementation 200, the bottom die 1006 includes a number of through via structures 1152 and 1158 extending through the bottom die 1006 (or at least the substrate 1106). Additionally, the middle die may also include a number of through via structures 1154 and 1156 extending through the middle die 1004 (or at least the substrate 1104). The redistribution structure 1008 also includes a number of RDL routes (e.g., formed as metal traces and/or vias) 1160 and 1162. The package substrate 1012 also includes a number of package routes (e.g., formed as metallization layers) 1170, 1172, and 1174.

In various embodiments, the package route 1172 can receive a supply voltage (e.g., VDD, VSS) through a package pin, and the voltage regulator 1120 and 1140 can receive such a supply voltage, VDD, and output regulated supply voltage $V_{DD1}$ and $V_{DD2}$ to the loads 1110 and 1130, respectively. $V_{DD1}$ and $V_{DD2}$ may be in different voltage domains, in some implementations. For example, $V_{DD1}$ and $V_{DD2}$ may be adopted by respective circuits or loads that have different functions.

Upon receiving the VDD through the package route 1172 as an input, the voltage regulator 1120 may output the $V_{DD1}$ to the load 1110 through the package route 1170, the RDL route 1160, the through via structure 1152 of the bottom die 1006, and the through via structure 1154 of the middle die 1004. As such, each of the through via structures 1152 and 1154 may sometimes be referred to as a power through via structure. Further, the voltage regulator 1120 can regulate or otherwise stabilize the $V_{DD1}$ based on a reference voltage (not shown) and a voltage ($V_{S1}$) sensed directly from the load 1110, which may be received by a differential amplifier of the voltage regulator 1120 as inputs. Specifically, the voltage regulator 1120 can receive the $V_{S1}$ through the through via structure 1156 of the middle die 1004 and the through via structure 1158 of the bottom die 1006. As such, each of the through via structures 1156 and 1158 may sometimes be referred to as a signal through via structure. In accordance with various embodiments, the signal through via structure may be formed in a smaller dimension than the power through via structure. For example, the signal through via structure may have a smaller diameter than the power through via structure.

In other words, a regulated supply voltage received by the load 1110 may include a number of paths, for example, path 1180 from the package route 1172 to the voltage regulator 1120, path 1181 from the voltage regulator 1120 to the package route 1170, path 1182 from the RDL route 1160 to the power through via structure 1152, path 1183 from the power through via structure 1152 to the power through via structure 1154, path 1184 from the power through via structure 1154 to the load 1110, path 1185 along local routes of the load 1110, (feedback) path 1186 from the load 1110 to the signal through via structure 1156, (feedback) path 1187 from the signal through via structure 1156 to the signal through via structure 1158, and (feedback) path 1188 from the signal through via structure 1158 to the voltage regulator 1120.

In some embodiments, the $V_{S1}$ may be sensed through a first pin of the load 1110 that is electrically coupled or integrated to a second pin of the load 1110 that receives the regulated voltage $V_{DD1}$, which causes a current flowing through the signal through via structures 1156 and 1158 to be substantially close to zero. As such, there is essentially no IR drop present on the signal through via structures 1156 and 1158. Further, any IR drop present along the path delivering the regulated supply voltage (e.g., the IR drop accumulated from the paths 1181 to 1185) can be absorbed by the voltage regulator 1120. For instance, the IR drop induced along at least one of the paths 1181 to 1185 (which may be presented as residue IR drop variation) can be forcibly pulled to the same voltage level as the reference voltage received by the amplifier of the voltage regulator 1120.

As a comparison, when a load and voltage regulator are disposed on the same die, the voltage regulator may be able to pick up (or sense) a regulated supply voltage (to the load). For example in FIG. 11, upon receiving the VDD received through the package route 1172 as an input, the voltage regulator 1140 may output the $V_{DD2}$ to the load 1130 through the RDL route 1162 and package route 1174. Further, the voltage regulator 1140 can regulate the $V_{DD2}$ based on a reference voltage (not shown) and a voltage ($V_{S2}$) sensed directly from the load 1130, which may be received by a differential amplifier of the voltage regulator 1140 as inputs. In other words, a regulated supply voltage received by the load 1130 may include path 1189 from the package route 1172 to the voltage regulator 1140, path 1190 from the voltage regulator 1140 to the RDL route 1162, path 1191 from the RDL route 1162 to the load 1130, and (feedback) path 1192 from the load 1130 to the voltage regulator 1140.

Figure 12:
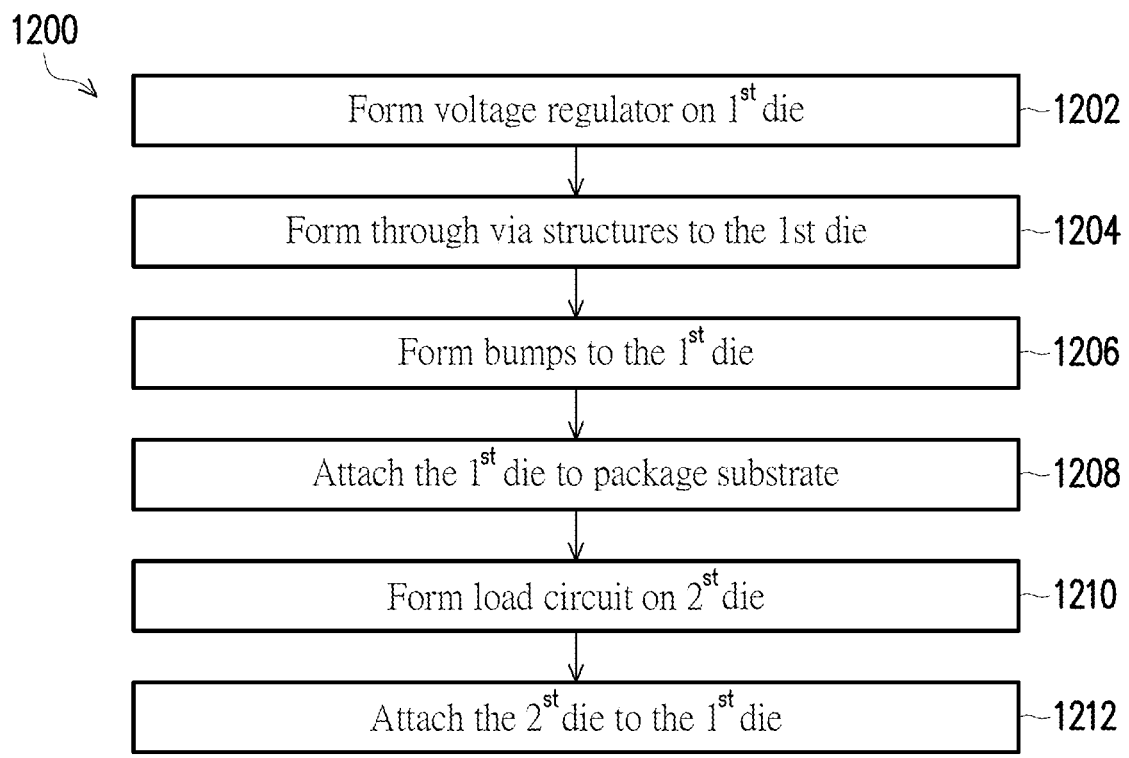
FIG. 12 is an example flow chart of a method for fabricating the semiconductor package of FIG. 1, in accordance with some embodiments.

FIG. 12 illustrates a flow chart of an example method 1200 for forming at least a portion of a semiconductor package, in accordance with some embodiments. It should be noted that the method 1200 is merely an example, and is not intended to limit the present disclosure. Accordingly, it is understood that the order of operation of the method 1200 of FIG. 12 can change, that additional operations may be provided before, during, and after the method 1200 of FIG. 12, and that some other operations may only be described briefly herein. Such a semiconductor package, made by the method 1200, may include at least a first (e.g., bottom) die and a second (e.g., top) die operatively and physically coupled to each other. For example, the semiconductor package may include the semiconductor package 100, as discussed above with respect to FIGS. 1-9. Accordingly, operations of the method 1200 will be discussed in conjunction with the components discussed with respect to FIGS. 1-9.

The method 1200 starts with operation 1202 of forming a voltage regulator on a first (e.g., bottom) die. For example, the voltage regulator (e.g., 220) may be formed on the first die (e.g., 104). Specifically, the voltage regulator 220 may be operatively constituted by a number of transistors, and these transistors may be formed along the major (e.g., front) surface of a substrate 204 of the first die 104.

Next, the method 1200 proceeds to operation 1204 of forming a number of through via structures to the first die. For example, the first die 104 includes through via structures 252 and 254. The through via structures 252 and 254 can extend through at least the substrate 204 of the first die 104. In various embodiments, the through via structures 252 and 254, formed in different sizes, are configured to deliver respectively different substances. For example, the through via structure 252, formed in a larger size (e.g., a larger diameter), can deliver a supply voltage, and the through via structure 254, formed in a smaller size (e.g., a smaller diameter), can deliver a sensed signal.

Next, the method 1200 proceeds to operation 1206 of forming a number of bumps to the first die. For example, a number of bumps 108 can be attached to the first die 104 with or without a redistribution structure. In various embodiments, the bumps 108 can be controlled collapse chip connection (C4) bumps. In various embodiments, the bumps 108 can be disposed on the frontside or a backside of the substrate 204 of the first die 104.

Next, the method 1200 proceeds to operation 1208 of attaching the first die to a package substrate. For example, after forming the bumps 108, the first die may be bonded to the package substrate (e.g., 110) using the bumps 108. The package substrate 110 may be, e.g., a printed circuit board (PCB) or the like, and may be connected to the intermediate package (e.g., the die 104 together with a redistribution structure if present) using the bumps 108.

Next, the method 1200 proceeds to operation 1210 of forming a load circuit on a second (e.g., top) die. For example, the load circuit (e.g., 210) may be formed on the second die (e.g., 102). Specifically, the load circuit 210 may be operatively constituted by a number of transistors, and these transistors may be formed along the major (e.g., front) surface of a substrate 202 of the second die 102.

Next, the method 1200 proceeds to operation 1212 of attaching the second die to the first die. For example, the second die 102 and first die 104 may be boned to each other through at least one of the following bonding techniques: hybrid bonding, microbumps, direct bonding, chemically activated bonding, plasma activated bonding, anodic bonding, eutectic bonding, glass frit bonding, adhesive bonding, thermo-compressive bonding, or reactive bonding. After bonding the second die 102 to the first die 104, the bonded dies attached to the package substrate can be sealed, which forms a completed semiconductor package. The completed semiconductor package can later be tested or verified as a whole.

Figure 13:
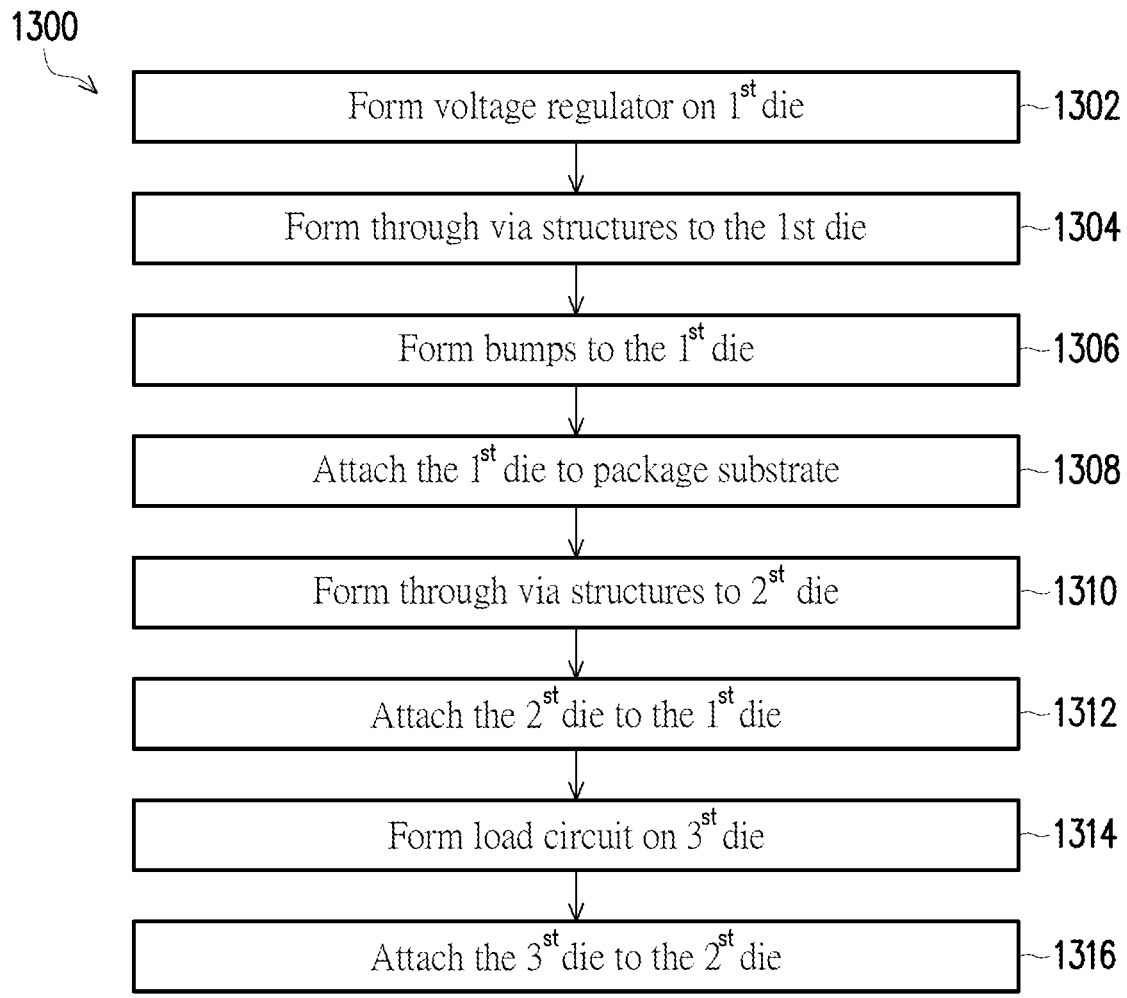
FIG. 13 is an example flow chart of a method for fabricating the semiconductor package of FIG. 10, in accordance with some embodiments.

FIG. 13 illustrates a flow chart of an example method 1300 for forming at least a portion of a semiconductor package, in accordance with some embodiments. It should be noted that the method 1300 is merely an example, and is not intended to limit the present disclosure. Accordingly, it is understood that the order of operation of the method 1300 of FIG. 13 can change, that additional operations may be provided before, during, and after the method 1300 of FIG. 13, and that some other operations may only be described briefly herein. Such a semiconductor package, made by the method 1300, may include at least a first (e.g., bottom) die, a second (e.g., middle) die, and a third (e.g., top) die operatively and physically coupled to each other. For example, the semiconductor package may include the semiconductor package 1000, as discussed above with respect to FIGS. 10-11. Accordingly, operations of the method 1300 will be discussed in conjunction with the components discussed with respect to FIGS. 10-11.

The method 1300 starts with operation 1302 of forming a voltage regulator on a first (e.g., bottom) die. For example, the voltage regulator (e.g., 1120) may be formed on the first die (e.g., 1006). Specifically, the voltage regulator 1120 may be operatively constituted by a number of transistors, and these transistors may be formed along the major (e.g., front) surface of a substrate 1106 of the first die 1006.

Next, the method 1300 proceeds to operation 1304 of forming a number of through via structures to the first die. For example, the first die 1006 includes through via structures 1152 and 1158. The through via structures 1152 and 1158 can extend through at least the substrate 1106 of the first die 1006. In various embodiments, the through via structures 1152 and 1158, formed in different sizes, are configured to deliver respectively different substances. For example, the through via structure 1152, formed in a larger size (e.g., a larger diameter), can deliver a supply voltage, and the through via structure 1158, formed in a smaller size (e.g., a smaller diameter), can deliver a sensed signal.

Next, the method 1300 proceeds to operation 1306 of forming a number of bumps to the first die. For example, a number of bumps 1010 can be attached to the first die 1006 with or without a redistribution structure. In various embodiments, the bumps 1010 can be controlled collapse chip connection (C4) bumps. In various embodiments, the bumps 1010 can be disposed on the frontside or a backside of the substrate 1106 of the first die 1006.

Next, the method 1300 proceeds to operation 1308 of attaching the first die to a package substrate. For example, after forming the bumps 1010, the first die may be bonded to the package substrate (e.g., 1012) using the bumps 1010. The package substrate 1012 may be, e.g., a printed circuit board (PCB) or the like, and may be connected to the intermediate package (e.g., the die 1006 together with a redistribution structure if present) using the bumps 1010.

Next, the method 1300 proceeds to operation 1310 of forming a number of through via structures to a second die. For example, the second die 1004 includes through via structures 1154 and 1156. The through via structures 1154 and 1156 can extend through at least the substrate 1104 of the second die 1004. In various embodiments, the through via structures 1154 and 1156, formed in different sizes, are configured to deliver respectively different substances. For example, the through via structure 1154, formed in a larger size (e.g., a larger diameter), can deliver a supply voltage, and the through via structure 1156, formed in a smaller size (e.g., a smaller diameter), can deliver a sensed signal.

Next, the method 1300 proceeds to operation 1312 of attaching the second die to the first die. For example, the second die 1004 and first die 1006 may be boned to each other through at least one of the following bonding techniques: hybrid bonding, microbumps, direct bonding, chemically activated bonding, plasma activated bonding, anodic bonding, eutectic bonding, glass frit bonding, adhesive bonding, thermo-compressive bonding, or reactive bonding.

Next, the method 1300 proceeds to operation 1314 of forming a load circuit on a third (e.g., top) die. For example, the load circuit (e.g., 1110) may be formed on the third die (e.g., 1002). Specifically, the load circuit 1110 may be operatively constituted by a number of transistors, and these transistors may be formed along the major (e.g., front) surface of a substrate 1102 of the third die 1002.

Next, the method 1300 proceeds to operation 1316 of attaching the third die to the second die. For example, the third die 1002 and second die 1004 may be boned to each other through at least one of the following bonding techniques: hybrid bonding, microbumps, direct bonding, chemically activated bonding, plasma activated bonding, anodic bonding, eutectic bonding, glass frit bonding, adhesive bonding, thermo-compressive bonding, or reactive bonding. After bonding the third die 1002 to the second die 1004, the bonded dies attached to the package substrate can be sealed, which forms a completed semiconductor package. The completed semiconductor package can later be tested or verified as a whole.

In one aspect of the present disclosure, a semiconductor package is disclosed. The semiconductor package includes a first die comprising a voltage regulator that has a first input and a second input. The semiconductor package includes a second die coupled to the first die and comprising a first load circuit. The voltage regulator is configured to provide a regulated voltage to the first load circuit through a first through via structure based on a first voltage received through the first input and a second voltage received from the first load circuit through a second through via structure. The first voltage is a constant reference voltage, and the second voltage is a first signal sensed from the first load circuit.

In another aspect of the present disclosure, a semiconductor package is disclosed. The semiconductor package includes a load circuit configured to receive a regulated supply voltage and output a sensed voltage. The semiconductor package includes a voltage regulator including an amplifier, wherein the amplifier is configured to receive a reference voltage and the sensed voltage so as to provide the regulated supply voltage. The regulated voltage is delivered to the load circuit using a first through via structure, and the sensed voltage is delivered to the amplifier using a second through via structure.

In yet another aspect of the present disclosure, a method for forming semiconductor packages is disclosed. The method includes forming a voltage regulator on a first substrate of a first die. The method includes forming at least a first through via structure and a second through via structure extending through the first substrate. The method includes attaching the first die to a package substrate. The method includes forming a load circuit on a second substrate of a second die. The method includes attaching the second die to the first die. The voltage regulator is configured to provide a regulated supply voltage to the load circuit through the first through via structure based on a reference voltage and a voltage sensed from the load circuit through the second through via structure.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first die comprising a voltage regulator that has a first input and a second input; and
    a second die coupled to the first die and comprising a first load circuit;
    wherein the voltage regulator is configured to provide a regulated voltage to the first load circuit through a first through via structure based on a first voltage received through the first input and a second voltage received from the first load circuit through a second through via structure; and
    wherein the first voltage is a constant reference voltage, and the second voltage is a first signal sensed from the first load circuit.

2. The semiconductor package of claim 1, wherein a current flowing through the second through via structure is substantially close to zero.

3. The semiconductor package of claim 1, wherein the voltage regulator includes a differential amplifier has the first input and second input.

4. The semiconductor package of claim 1, wherein the first through via structure and second through via structure each extend through a first substrate of the first die.

5. The semiconductor package of claim 1, further comprising:
    a package substrate; and
    a redistribution structure;
    wherein the first die is electrically coupled to the package substrate through the redistribution structure, and the second die is electrically coupled to the first die.

6. The semiconductor package of claim 5, wherein the voltage regulator is configured to receive a supply voltage through the package substrate, and to provide the regulated voltage further through the package substrate and the redistribution structure.

7. The semiconductor package of claim 5, wherein a frontside of a first substrate of the first die faces the package substrate with the redistribution structure interposed therebetween, and a backside of the first substrate faces a frontside of a second substrate of the second die.

8. The semiconductor package of claim 5, wherein a backside of a first substrate of the first die faces the package substrate with the redistribution structure interposed therebetween, and a frontside of the first substrate faces a frontside of a second substrate of the second die.

9. The semiconductor package of claim 1, wherein a first size of the first through via structure is substantially greater than a second size of the second through via structure.

10. The semiconductor package of claim 1, wherein the second die further comprises a second load circuit; and wherein the voltage regulator is configured to provide the regulated voltage to each of the first load circuit and second load circuit based on the first voltage and the second voltage received from both of the first load circuit and second load circuit through the second through via structure.

11. The semiconductor package of claim 10, wherein the second voltage is an averaged signal of the first signal and a second signal sensed from the second load circuit.

12. The semiconductor package of claim 10, wherein the second die comprises:
    a first interconnect path electrically coupling the first load circuit to the second through via structure; and
    a second first interconnect path electrically coupling the second load circuit to the second through via structure;
    wherein the first and second interconnect paths have substantially similar lengths.

13. A semiconductor package, comprising:
    a first die comprising a voltage regulator that has a first input and a second input; and
    a second die coupled to the first die and comprising a first load circuit;
    wherein the voltage regulator is configured to provide a regulated voltage to the first load circuit through a first through via structure based on a first voltage received through the first input and a second voltage received from the first load circuit through a second through via structure;
    wherein the first voltage is a constant reference voltage, and the second voltage is a first signal sensed from the first load circuit; and
    wherein a current flowing through the second through via structure is substantially close to zero.

14. The semiconductor package of claim 13, wherein the voltage regulator includes a differential amplifier has the first input and second input.

15. The semiconductor package of claim 13, wherein the first through via structure and second through via structure each extend through a first substrate of the first die.

16. The semiconductor package of claim 13, wherein a first size of the first through via structure is substantially greater than a second size of the second through via structure.

17. A semiconductor package, comprising:
    a first die comprising a voltage regulator that has a first input and a second input;
    a second die coupled to the first die and comprising a first load circuit;
    a package substrate; and
    a redistribution structure;
    wherein the first die is electrically coupled to the package substrate through the redistribution structure, and the second die is electrically coupled to the first die;
    wherein the voltage regulator is configured to provide a regulated voltage to the first load circuit through a first through via structure based on a first voltage received through the first input and a second voltage received from the first load circuit through a second through via structure;
    wherein the first voltage is a constant reference voltage, and the second voltage is a first signal sensed from the first load circuit.

18. The semiconductor package of claim 17, wherein the voltage regulator is configured to receive a supply voltage through the package substrate, and to provide the regulated voltage further through the package substrate and the redistribution structure.

19. The semiconductor package of claim 17, wherein a frontside of a first substrate of the first die faces the package substrate with the redistribution structure interposed therebetween, and a backside of the first substrate faces a frontside of a second substrate of the second die.

20. The semiconductor package of claim 17, wherein a backside of a first substrate of the first die faces the package substrate with the redistribution structure interposed therebetween, and a frontside of the first substrate faces a frontside of a second substrate of the second die.

\* \* \* \* \*